United States Patent
Misumi

(10) Patent No.: US 8,928,087 B2
(45) Date of Patent: Jan. 6, 2015

(54) SEMICONDUCTOR DEVICE

(71) Applicant: Tadashi Misumi, Nisshin-shi (JP)

(72) Inventor: Tadashi Misumi, Nisshin-shi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 60 days.

(21) Appl. No.: 13/687,349

(22) Filed: Nov. 28, 2012

(65) Prior Publication Data

US 2013/0134521 A1    May 30, 2013

(30) Foreign Application Priority Data

Nov. 29, 2011 (JP) .................................. 2011-259782

(51) Int. Cl.
| | |
|---|---|
| *H01L 29/76* | (2006.01) |
| *H01L 29/94* | (2006.01) |
| *H01L 27/088* | (2006.01) |
| *H01L 23/36* | (2006.01) |
| *H01L 29/423* | (2006.01) |
| *H01L 29/78* | (2006.01) |
| *H01L 29/10* | (2006.01) |
| *H01L 29/739* | (2006.01) |

(52) U.S. Cl.
CPC ............. *H01L 27/088* (2013.01); *H01L 23/36* (2013.01); *H01L 29/4236* (2013.01); *H01L 29/42368* (2013.01); *H01L 29/7813* (2013.01); *H01L 29/1095* (2013.01); *H01L 29/7397* (2013.01)
USPC ........... 257/368; 257/327; 257/262; 438/192; 438/268

(58) Field of Classification Search
CPC ... H01L 27/088; H01L 29/78; H01L 27/0207; H01L 29/66477; H01L 23/36
USPC .................... 257/368, 327, 262; 438/192, 268
See application file for complete search history.

(56) References Cited

U.S. PATENT DOCUMENTS

| | | |
|---|---|---|
| 5,729,032 A | 3/1998 | Tomomatsu et al. |
| 2002/0089015 A1 | 7/2002 | Nakanishi et al. |

FOREIGN PATENT DOCUMENTS

| | | |
|---|---|---|
| JP | A-7-240516 | 9/1995 |
| JP | A-2002-134750 | 5/2002 |
| JP | A-2002-231943 | 8/2002 |
| JP | A-2005-116702 | 4/2005 |
| JP | A-2007-110002 | 4/2007 |

*Primary Examiner* — Theresa T Doan
(74) *Attorney, Agent, or Firm* — Oliff PLC

(57) ABSTRACT

A semiconductor device is equipped with an element region, an electrode, a thermal conduction portion, and a protective membrane. The element region is equipped with a plurality of gate electrodes. The electrode is formed on a surface of the element region. The thermal conduction portion is located on a surface side of a central portion of the electrode, and is higher in thermal conductivity than the element region. The protective membrane is formed on a peripheral portion that is located on the surface side of the electrode and surrounds a periphery of the central portion. In the element region, an emitter central region that is formed on a back side of the central portion of the electrode remains on for a longer time than an emitter peripheral region that is formed on a back side of the peripheral portion of the electrode.

9 Claims, 3 Drawing Sheets

US 8,928,087 B2

SEMICONDUCTOR DEVICE

INCORPORATION BY REFERENCE

The disclosure of Japanese Patent Application No. 2011-259782 filed on Nov. 29, 2011 including the specification, drawings and abstract is incorporated herein by reference in its entirety.

BACKGROUND OF THE INVENTION

1. Field of the Invention

The invention relates to a semiconductor device.

2. Description of the Related Art

For example, in Japanese Patent Application Publication No. 2005-116702 (JP-2005-116702 A), there is disclosed a semiconductor module having a high thermal conductor joined to part of a surface of an electrode of a semiconductor element.

In the case where the semiconductor module of Japanese Patent Application Publication No. 2005-116702 (JP-2005-116702 A) operates in a short-circuit state (i.e., a state where a load such as an inductance or the like is not connected to the semiconductor module), when the semiconductor element is turned on, a large electric current flows through the semiconductor element. Out of the semiconductor element in the semiconductor module, in a region on a back side of the high thermal conductor, heat generated through the flow of the electric current is diffused via the high thermal conductor. However, out of the semiconductor element, in a region other than the back side of the high thermal conductor, it is difficult to diffuse, via the high thermal conductor, the heat generated through the flow of the electric current. Thus, in the case where the semiconductor module of Japanese Patent Application Publication No. 2005-116702 (JP-2005-116702 A) operates in a short-circuit state, the temperature of the region other than the back side of the high thermal conductor, as pert of the semiconductor element, becomes high. Consequently, the short-circuit capacity as the entire semiconductor device may become low.

SUMMARY OF THE INVENTION

The invention can enhance the short-circuit capacity of an entire semiconductor device in the case where the semiconductor device operates in a short-circuit state.

In an aspect of the invention, a semiconductor device includes a semiconductor element region that is equipped with a plurality of insulated gates, an electrode that is formed on a surface of the semiconductor element region, a thermal conduction member that is located on a surface side of a central portion of the electrode, and a protective membrane that is formed on a surface of the electrode on a peripheral portion surrounding the central portion. In this semiconductor device, the thermal conduction member is higher in thermal conductivity than the protective membrane, and out of regions included in the semiconductor element region, a central region that is formed on a back side of the central portion of the electrode remains on for a longer time than a peripheral region that is formed on a back side of the peripheral portion of the electrode.

In the foregoing aspect of the invention, the thermal conduction member is provided on the surface side of the central portion of the electrode. Thus, even in the case where the semiconductor device operates in a short-circuit state, heat generated in the central region of the semiconductor element region is diffused via the thermal conduction member. Thus, the short-circuit capacity of the central region can be enhanced. Besides, although the thermal conduction member is not provided on the surface side of the peripheral portion of the electrode, the peripheral region of the semiconductor element region remains on for a shorter time than the central region of the semiconductor element region. Thus, the time during which an electric current flows through the peripheral region of the semiconductor element region can be made shorter than the time during which an electric current flows through the central region of the semiconductor element region. As a result, the total amount of the electric current flowing through the peripheral region can be reduced, and the short-circuit capacity of the peripheral region as well as the short-circuit capacity of the central region can be enhanced. Accordingly, the short-circuit capacity of the entire semiconductor device in the case where the semiconductor device operates in a short-circuit state can be enhanced.

In the foregoing aspect of the invention, the plurality of the insulated gates may include a plurality of first insulated gates that are formed in the central region, and a plurality of second insulated gates that are formed in the peripheral region, and an average of threshold voltages of the first insulated gates at a time when the central region is turned on may be lower than an average of threshold voltages of the second insulated gates at a time when the peripheral region is turned on. According to this configuration, in the case where the semiconductor device is turned on, the peripheral region of the semiconductor element region can be tuned on later than the central region of the semiconductor element region. Besides, in the case where the semiconductor device is turned off, the peripheral region of the semiconductor element region can be turned off earlier than the central region of the semiconductor element region. Thus, the time during which an electric current flows through the peripheral region can be made shorter than the time during which an electric current flows through the central region. As a result, the density of energy applied to the peripheral region can be made lower than the density of energy applied to the central region. Accordingly, the short-circuit capacity of the entire semiconductor device in the case where the semiconductor device operates in a short-circuit state can be enhanced.

In the foregoing aspect of the invention, the plurality of the insulated gates may include a plurality of first insulated gates that are formed in the central region, and a plurality of second insulated gates that are formed in the peripheral region, and an average of gate resistance values of the first insulated gates may be lower than an average of gate resistance values of the second insulated gates. According to this configuration, in the case where the semiconductor device is turned on, the peripheral region of the semiconductor element can be turned on later than the central region of the semiconductor element. Thus, the time during which an electric current flows through the peripheral region can be made shorter than the time during which an electric current flows through the central region. Besides, according to the aforementioned configuration, the rising of the electric current in the peripheral region of the semiconductor element region can be made later than the rising of the electric current in the central region of the semiconductor element region. As a result, the density of energy applied to the peripheral region can be made lower than the density of energy applied to the central region. Accordingly, the short-circuit capacity of the entire semiconductor device in the case where the semiconductor device operates in a short-circuit state can be enhanced.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

First Embodiment

Figure 1:
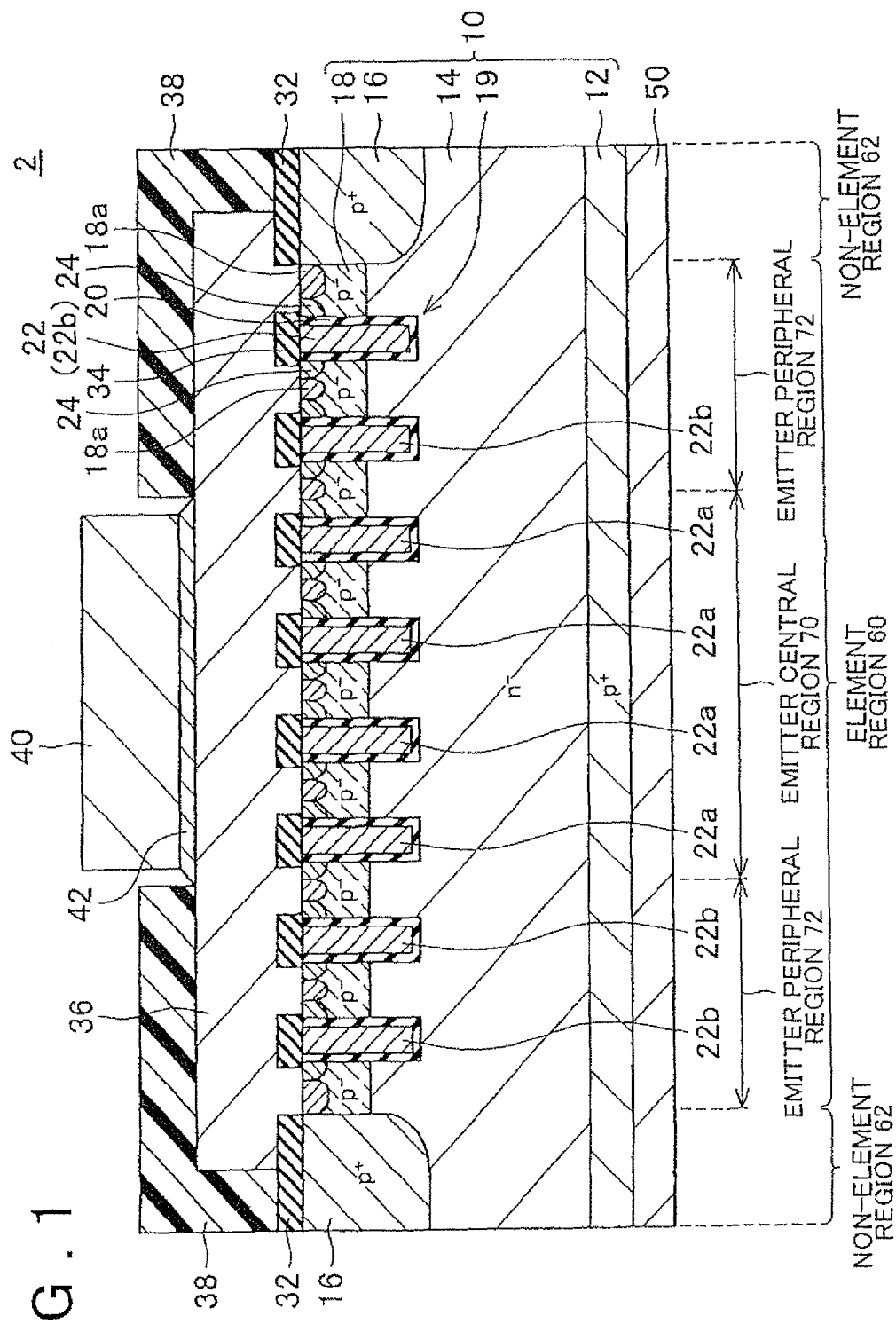
FIG. 1 is a cross-sectional view showing a semiconductor device according to the first embodiment of the invention.

A semiconductor device 2 according to the first embodiment of the invention shown in FIG. 1 is equipped with a semiconductor substrate 10, an electrode 36, protective membranes 38, a thermal conduction member 40, and a back electrode 50.

The semiconductor substrate 10 is a Si substrate that is equipped with an element region 60 and non-element regions 62. A plurality of trenches 19 are formed in a surface (an upper face in FIG. 1) of the element gin 60 of the semiconductor substrate 10. Insulating membranes 20 are formed on wall surfaces of the trenches 19 respectively. In this embodiment of the invention, the insulating membranes 20 are silicon oxide membranes. Gate electrodes 22 are formed in the trenches 19 respectively. In a region facing the surface of the element region 60, $n^+$-type emitter regions 24 and $p^+$-type body contact regions 18a are selectively formed. Each of the emitter regions 24 is formed in contact with a corresponding one of the insulating membranes 20. Each of the body contact regions 18a is formed adjacently to a corresponding one of the emitter regions 24. Each of $p^-$-type body regions 38 is formed below a corresponding one of the emitter regions 24 and a corresponding one of the body contact regions 18a. Each of the body regions 18 is formed in contact with a corresponding one of the insulating membranes 20 below a corresponding one of the emitter regions 24. The body regions 18 are formed to a position shallower than lower ends of the trenches 19. The concentration of p-type impurities in the body regions 18 is lower than the concentration of p-type impurities in the body contact regions 18a.

On the other hand, in regions facing surfaces of the non-element regions 62, $p^+$-type diffusion layers 16 are formed. The diffusion layers 16 are formed to a position deeper than the body regions 18 of the element region 60.

Below the body regions 18 and the diffusion layers 16, there is formed an $n^-$-type drift layer 14. The drift layer 14 is separated from the emitter regions 24 by the body regions 18. In a region that is located below the drift layer 14 and faces a back face (a lower face in FIG. 1) of the semiconductor substrate 10, there is formed a $p^+$-type collector layer 12. The collector layer 12 is separated from the body regions 18 by the drift layer 14. In the element region 60, a multitude of insulated gate bipolar transistors (IGBT's) are formed by the emitter regions 24, the body regions 18, the drift layer 14, the collector layer 12, and the gate electrodes 22. The IGBT's formed in the element region 60 will be referred to hereinafter as IGBT's 60 in some cases.

A back electrode 50 is formed on the back face of the semiconductor substrate 10 over the entirety thereof. The back electrode 50 is ohmically connected to the collector layer 12.

Insulating membranes 34 are formed on surfaces of the respective gate electrodes 22 as part of the surface of the semiconductor substrate 10. Besides, insulating membranes 32 are formed also on surfaces of the diffusion layers 16 as part of the surface of the semiconductor substrate 10. Besides, an electrode 36 is formed on the surface of the semiconductor substrate 10. The electrode 36 is formed of Al. The electrode 36 is so formed as to cover the respective insulating membranes 34 and parts of the insulating membranes 32. The electrode 36 is ohmically connected to the emitter regions 24 and the body contact regions 18a. Besides, the electrode 36 it insulated from the gate electrodes 22 by the insulating membranes 34. The gate electrodes 22 are connected to electrode pads (not shown) provided on the semiconductor substrate 10. Besides, the electrode 36 is insulated from the diffusion layers 16 by the insulating membranes 32.

The thermal conduction member 40 is formed on a surface of a central portion of the electrode 36. The thermal conduction member 40 is higher in thermal conductivity than the protective membranes 38 and the element region 60 of the semiconductor substrate 10. The thermal conductivity of the thermal conduction member 40 can be set equal to or higher than, for example, 100 W/m·K. In this embodiment of the invention, Cu is used as the thermal conduction member 40. The thermal conduction member 40 is joined to the surface of the central portion of the electrode 36 via a solder 42. More specifically, the surface of the electrode 36 made of Al is plated with Ni, and the thermal conduction member 40 is fixed onto the Ni-plated membrane by the solder 42.

The protective membranes 38 are formed on a surface of a peripheral portion surrounding the periphery of the central portion of the electrode 36. The protective membranes 38 are formed also on those regions of the surfaces of the insulating membranes 32 on which the electrode 36 is not formed. The protective membranes 38 are formed by a resin having insulating properties. For example, polyimide can be used for the protective membranes 38.

In this embodiment of the invention, the element region 60 is equipped with an emitter central region 70 that is formed on the back side of the central portion of the electrode 36 (i.e., the back side of the thermal conduction member 40), and emitter peripheral regions 72 that are formed on the back sides of the peripheral portions of the electrode 36 (i.e., the back sides of the protective membranes 38). Each of the emitter central region 70 and the emitter peripheral regions 72 is equipped with a plurality of the gate electrodes 22. That is, each of the emitter central region 70 and the emitter peripheral regions 72 is equipped with a plurality of the IGBT's. The gate electrodes 22 with which the emitter central region 70 is equipped will be referred to hereinafter as central gates 22a. Besides, the gate electrodes 22 with which the emitter peripheral regions 72 are equipped will be referred to as peripheral gates 22b.

In this embodiment of the invention, the average of threshold voltages of the respective central gates 22a at the time when the IGBT's in the emitter central region 70 are turned on is lower than the average of threshold voltages of the respective peripheral gates 22b at the time when the IGBT's in the emitter peripheral regions 72 are turned on. To be more specific, in this embodiment of the invention, the threshold voltages of the gate electrodes 22 are made different according to location by making the concentration of p-type impurities in the body regions 18 in the emitter central region 70 and the concentration of p-type impurities in the body regions 18 in the emitter peripheral region 72 different from each other. The threshold voltages of the gate electrodes 22 increase as the concentration of p-type impurities in the body regions 18 increases. That is, in this embodiment of the invention, the body regions 18 are formed such that the concentration of p-type impurities in the emitter central region 70 becomes lower than the concentration of p-type impurities in the emitter peripheral region 72.

Incidentally, in an additional example, the threshold voltages of the gate electrodes 22 can also be individually changed by changing the thickness of each of the insulating membranes 20 for a corresponding one of the trenches 19. The threshold voltage of each of the gate electrodes 22 increases as the thickness of a corresponding one of the insulating membranes 20 increases. That is, in this additional example, the respective insulating membranes 20 may be formed such that the thicknesses of the insulating membranes 20 of the trenches 19 with which the emitter central region 70 is equipped become smaller than the thicknesses of the insulating membranes 20 of the trenches 19 with which the emitter peripheral regions 72 are equipped.

Next, the operation of the semiconductor device 2 according to this embodiment of the invention will be described. The semiconductor device 2 according to this embodiment of the invention is used with the electrode 36 connected to a ground potential via an external device (not shown) (e.g. a motor or the like), and with the back electrode 50 connected to a power supply potential. When a voltage is applied to the semiconductor device 2, the IGBT's 60 become low in potential on the emitter side (the electrode 36), and become high in potential on the collector side (the back electrode 50). In this state, when a positive potential (a gate-emitter voltage) is applied to the gate electrodes 22, the body regions 18 within a range of contact with the insulating membranes 20 are reversed from the p-type to the n-type, so that channels are formed. When the channels are formed, electrons flow from the electrode 36 to the beck electrode 50 via the emitter regions 24, the channels in the body regions 18, the drift layer 14, and the collector layer 12. Besides, holes flow from the back electrode 50 into the drift layer 14 through the collector layer 12. Then, a conductivity modulation phenomenon occurs in the drift layer 14, so that the electric resistance of the drift layer 14 greatly decreases. That is, the IGBT's 60 are turned on. That is, a collector current flows through the IGBT's 60. When the application of a potential to the gate electrodes 22 is stopped, the channels disappear, and the IGBT's 60 are turned off. That is, the collector current flowing to the IGBT's 60 decreases, and disappears.

Figure 2:
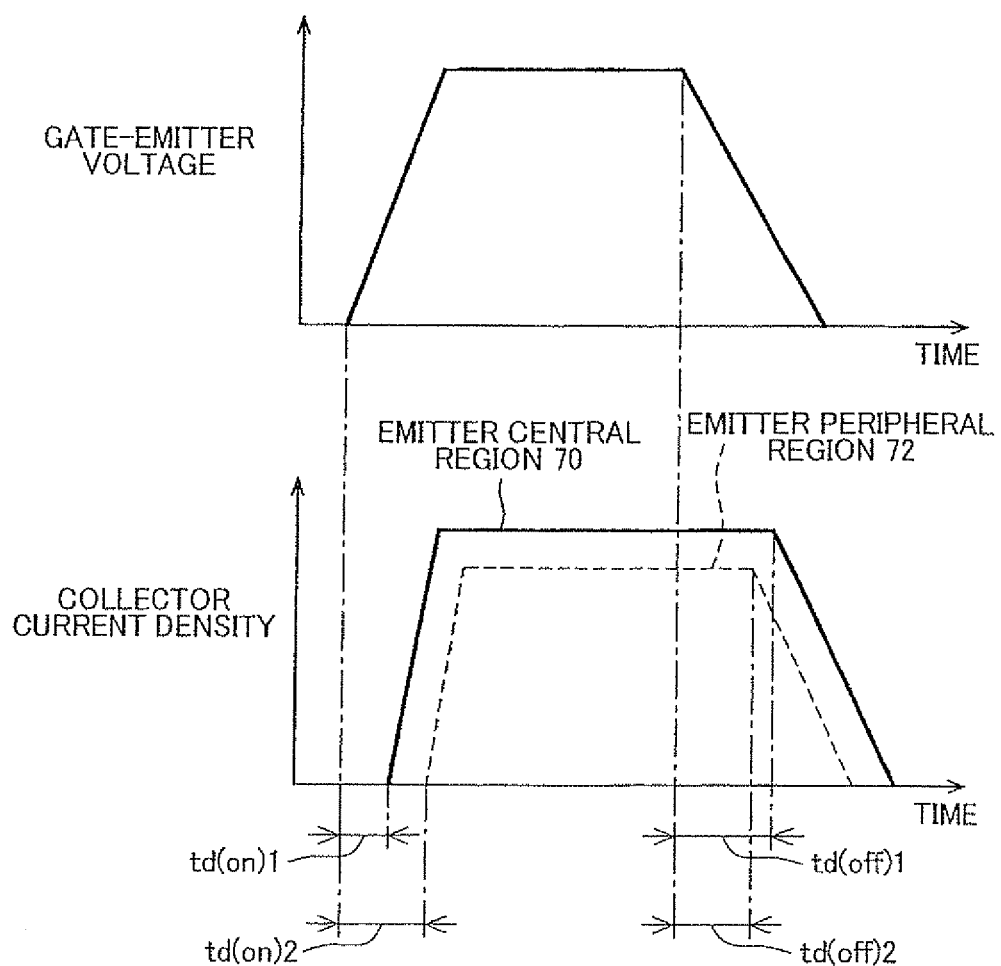
FIG. 2 includes graphs showing the operation of the semiconductor device according to the first embodiment of the invention.

In the semiconductor device 2 according to this embodiment of the invention, as indicated by the upper graph of FIG. 2, when a positive potential (a gate-emitter voltage) is applied to the respective gate electrodes 22, the gate-emitter voltage increases with the lapse of time. Then, as indicated by the lower graph of FIG. 2, the IGBT's in the emitter central region 70, which is equipped with the central gates 22a whose average of threshold voltages is low, are first turned on, and a collector current starts flowing therethrough. That is, in the semiconductor device 2 according to this embodiment of the invention, since the average of threshold voltages of the central gates 22a is relatively low, the IGBT's in the emitter central region 70 are turned on even in the case where a relatively low potential is applied to the central gates 22a. In FIG. 2, a time from the application of a positive potential to the respective gate electrodes 22 to the turning on of the IGBT's in the emitter central region 70 is denoted by td(on)1.

After that, when the applied gate-emitter voltage further increases, the IGBT's in the emitter peripheral regions 72 that are equipped with the peripheral gates 22b whose average of threshold voltages is high are turned on, and a collector current starts lowing therethrough, as indicated by the lower graph of FIG. 2. That is, in the semiconductor device 2 according to this embodiment of the invention, since the average of threshold voltages of the peripheral gates 22b is relatively high, the IGBT's in the emitter peripheral regions 72 are turned on in the case where a relatively high potential is applied to the peripheral gates 22b. In FIG. 2, a time from the application of a positive potential to the respective electrodes 22 to the turning on of the IGBT's in the emitter peripheral regions 72 is denoted by td(on)2. As shown in FIG. 2, td(on)2 is longer than td(on)1.

When the IGBT's in the emitter central region 70 and the IGBT's in the emitter peripheral regions 72 are turned on, the gate-emitter voltage then becomes saturated, and the collector current flowing through each of the IGBT's becomes saturated. The saturation current flowing through each of the IGBT's is proportional to the square of the difference between the gate-emitter voltage and the threshold voltage. Thus, in this embodiment of the invention, as indicated by the lower graph of FIG. 2, the saturation current flowing through each of the IGBT's in the emitter peripheral regions 72 is lower than the saturation current flowing through each of the IGBT's in the emitter central region 70.

After that, when the application of the voltage (the application of the gate-emitter voltage) to each of the gate electrodes 22 is stopped, the gate-emitter voltage decreases with the lapse of time. Then, as indicated by the lower graph of FIG. 2, the IGBT's in the emitter peripheral legions 72 that are equipped with the peripheral gates 22b whose average of threshold voltages is high are first turned off and the collector current starts decreasing. That is, in the semiconductor device 2 according to this embodiment of the invention, since the average of threshold voltages of the peripheral gates 22b is relatively high, the IGBT's in the emitter peripheral region 72 are turned off even in the case where the gate-emitter voltage is relatively high. In FIG. 2, a time from the start of decrease in the gate-emitter voltage to the turning off of the IGBT's in the emitter peripheral regions 72 is denoted by td(off)2.

After that, when the gate-emitter voltage further decreases, the IGBT's in the emitter central region 70 that is equipped with the central gates 22a whose average of threshold voltages is low are turned off and the collector current starts decreasing, as indicated by the lower graph of FIG. 2. That is, in the central gates 22a whose average of threshold voltages is low, the IGBT's in the emitter central region 70 are turned off in the case where the gate-emitter voltage becomes relatively low. In FIG. 2, a time from the start of decrease in the gate-emitter voltage to the turning off of the IGBT's in the emitter peripheral regions 72 is denoted by td(off)1. As shown in FIG. 2, td(off)2 is shorter than td(off)1.

As described above, in the semiconductor device 2 according to this embodiment of the invention, the IGBT's in the emitter peripheral regions 72 are turned on later than the IGBT's in the emitter central region 70, and are turned off earlier than the IGBT's in the emitter central region 70. That is, the time during which the IGBT's in the emitter peripheral regions 72 are on is shorter than the time during which the IGBT's in the emitter central region 70 are on. Thus, the time during which an electric current flows through the emitter peripheral regions 72 can be made shorter than the time during which an electric current flows through the emitter central region 70. Besides, the saturation current flowing through each of the IGBT's in the emitter peripheral regions 72 is lower than the saturation current flowing through each of the IGBT's in the emitter central region 70. Thus, in the semiconductor device 2 according to this embodiment of the invention, the density of energy applied to the emitter peripheral regions 72 can be made lower than the density of energy applied to the emitter peripheral region 70.

Besides, the external device connected to the electrode 36 may short-circuit depending on the operation state thereof or the like. When the semiconductor device 2 is operated to be turned on as described above in a state where the external device has short-circuited (hereinafter referred to as a short-circuit state), a large electric current flows through the IGBT's 60. When a large electric current flows through the IGBT's 60, the potential in the body regions 18 rises, and a voltage is applied to pn-joints between the body regions 18 and the emitter regions 24. Thus, when these pn-joints become conductive, the IGBT's 60 are latched up. Thus, in the case where a large electric current has flowed through the IGBT's 60, the voltages applied to the gate electrodes 22 need to be reduced to turn the IGBT's 60 off within a time that is set as a short-circuit capacity.

It should be noted herein that it is effective to restrain the temperature of the IGBT's 60 from rising in order to enhance the short-circuit capacity of the IGBT's 60. As described above, in the semiconductor device 2 according to this embodiment of the invention, the thermal conduction member 40 is provided on the surface of the central portion of the electrode 36. Thus, even in the case where the semiconductor device 2 operates in a short-circuit state, heat generated by the IGBT's in the emitter central region 70 is diffused via the thermal conduction member 40. Thus, the short-circuit capacity of the emitter central region 70 can be enhanced. On the other hand, in the semiconductor device 2 according to this embodiment of the invention, the protective membranes 38 are formed on the surface of the peripheral portion of the electrode 36, and the thermal conduction member 40 is not provided thereon. However, in the case where the semiconductor device 2 according to this embodiment of the invention is operated, the time during which the IGBT's in the emitter peripheral regions 72 are on is shorter than the time during which the IGBT's in the emitter central region 70 are on. Besides, the saturation current flowing through each of the IGBT's in the emitter peripheral regions 72 is smaller than the saturation current flowing through each of the IGBT's in the emitter central region 70. Thus, the density of energy applied to the emitter peripheral regions 72 can be made lower than the density of energy applied to the emitter central region 70. As a result, the temperature of the emitter peripheral regions 72 is restrained from rising, and the short-circuit capacity of the emitter peripheral regions 72 as well as the short-circuit capacity of the emitter central region 70 can be enhanced. Accordingly, the short-circuit capacity of the entire semiconductor device 2 in the case where the semiconductor device 2 operates in a short-circuit state can be enhanced.

The semiconductor device 2 according to this embodiment of the invention has been described above in detail. In this embodiment of the invention, the element region 60 is an example of "the semiconductor element region". The gate electrodes 22 are an example of "the insulated gates". The emitter central region 70 and the emitter peripheral regions 72 are examples of "the central region" and "the peripheral region", respectively. The central gates 22a and the peripheral gates 22b are examples of "the first insulated gate" and "the second insulated gate", respectively.

Second Embodiment

The second embodiment of the invention will be described focusing on what is different from the first embodiment of the invention. In the second embodiment of the invention, the semiconductor device 2 has a basic configuration common to the semiconductor device 2 according to the first embodiment of the invention (see FIG. 1). The semiconductor device 2 according to the second embodiment of the invention is different from the semiconductor device 2 according to the first embodiment of the invention not in that the threshold voltages of the gate electrodes 22 are made different from one another according to location, but in that the gate resistance values of the gate electrodes 22 are made different from one another.

That is, in the second embodiment of the invention, the average of gate resistance values of the respective central gates 22a at the time when the IGBT's in the emitter central region 70 are turned on is made lower than the average of gate resistance values of the respective peripheral gates 22b at the time when the IGBT's in the emitter peripheral regions 72 are turned on. To be more specific, in the second embodiment of the invention, the width of the trenches 19 in the emitter central region 70 and the width of the trenches 19 in the emitter peripheral regions 72 are made different from each other, so that the gate resistance values of the gate electrodes 22 are made different from one another. The gate resistance value increases as the width of the trenches 19 decreases. That is, in the second embodiment of the invention, the trenches 19 are formed such that the width of the trenches 19 in the emitter central region 70 becomes wider than the width of the trenches 19 in the emitter peripheral regions 72.

Incidentally, in an additional example, the gate resistance values of the gate electrodes 22 can also be made different from one another by making the concentrations of impurities (e.g., phosphorous) contained in the gate electrodes 22 different from one another. The gate resistance value increases as the concentration of impurities contained in the gate electrodes 22 decreases. That is, in this additional example, the respective gate electrodes are formed such that the concentration of impurities contained in the peripheral gates 22b becomes lower than the concentration of impurities contained in the central gates 22a.

Figure 3:
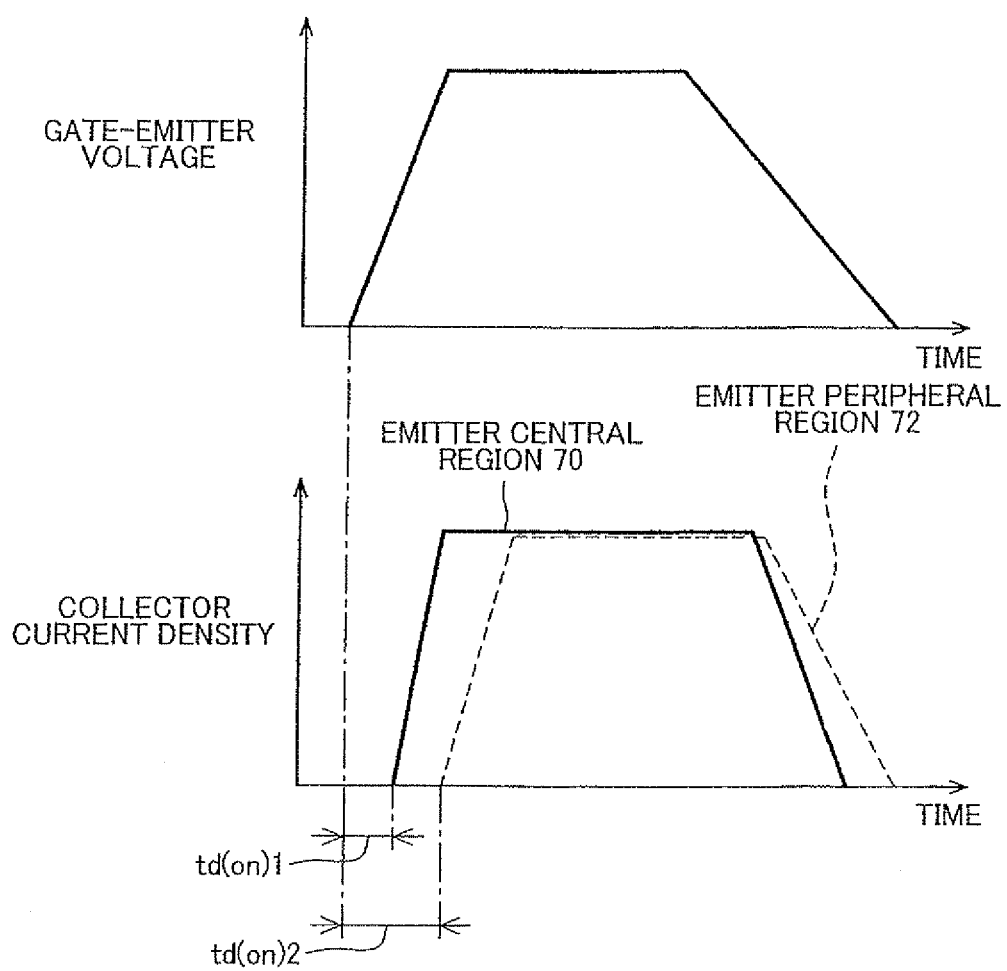
FIG. 3 includes graphs showing the operation of a semiconductor device according to the second embodiment of the invention.

Next, the operation of the semiconductor device 2 according to the second embodiment of the invention will be described. In the semiconductor device 2 according to this embodiment of the invention as well, as indicated by the upper graph of FIG. 3, when a positive potential (a gate-emitter voltage) is applied to the respective gate electrodes 22, the gate-emitter voltage increases with the lapse of time. Then, as indicated by the lower graph of FIG. 2, the IGBT's in the emitter central region 70 that is equipped with the central gates 22a whose average of gate resistance values is low are first turned on, and a collector current starts flowing therethrough. That is, in the semiconductor device 2 according to this embodiment of the invention, since the average of gate resistance values of the central gates 22a is relatively low, the IGBT's in the emitter central region 70 are turned on even in the case where a relatively low potential is applied to the central gates 22a. In FIG. 3, a time from the application of a positive potential to the respective gate electrodes 22 to the turning on of the IGBT's in the emitter central region 70 is denoted by td(on)1.

After that, when the applied gate-emitter voltage further increases, the IGBT's in the emitter peripheral region 72 that is equipped with the peripheral gates 22b whose average of gate resistance values is relatively high are turned on, and a collector current starts flowing therethrough, as indicated by the lower graph of FIG. 3. That is, in the semiconductor device 2 according to this embodiment of the invention, since the average of gate resistance values of the peripheral gates 22b is relatively high, the IGBT's in the emitter peripheral regions 72 are turned on in the case where a relatively high potential is applied to the peripheral gates 22b. Besides, in this embodiment of the invention, the rising (di/dt) of the collector current flowing through the IGBT's in the emitter peripheral regions 72 is later than the rising of the collector current flowing through the IGBT's in the emitter central region 70. In FIG. 3, a time from the application of a positive potential to the respective gate electrodes 22 to the turning on of the IGBT's in the emitter peripheral regions 72 is denoted by td(on)2. As shown in FIG. 3, td(on)2 is longer than td(on)1.

When the IGBT's in the emitter central region 70 and the IGBT's in the emitter peripheral regions 72 are tuned on, the gate-emitter voltage than becomes saturated, and the collector current flowing through each of the IGBT's becomes saturated. In this embodiment of the invention, the threshold voltages of the respective gate electrodes 22 are equal to one another. Thus, in this embodiment of the invention, as indicated by the lower graph of FIG. 3, the saturation current flowing through each of the IGBT's in the emitter peripheral regions 72 and the saturation current flowing through each of the IGBT's in the emitter central region 70 are equal to each other.

After that, when the application of the voltage (the application of the gate-emitter voltage) to the respective gate electrodes 22 is stopped, the gate-emitter voltage decreases with the lapse of time. Then, as indicated by the lower graph of FIG. 3, the IGBT's in the emitter central region 70 whose average of gate resistance values is low are first turned off and the IGBT's in the emitter peripheral regions 72 whose average of gate resistance values is high are then turned off. Accordingly, the collector current flowing through each of the IGBT's in the emitter central region 70 disappears earlier than the collector count flowing through each of the IGBT's in the emitter peripheral regions 72.

As described above in the semiconductor device 2 according to this embodiment of the invention, the IGBT's in the emitter peripheral regions 72 are turned on later than the IGBT's in the emitter central region 70. Thus, the time during which an electric current flows through the emitter peripheral regions 72 can be made shorter than the time during which an electric current flows through the emitter central region 70. Besides, the rising (di/dt) of the collector current flowing through each of the IGBT's in the emitter peripheral region 72 is later than the rising (di/dt) of the collector current flowing through each of the IGBT's in the emitter central region 70. Thus, the density of energy applied to the emitter peripheral regions 72 can be made lower than the density of energy applied to the emitter central region 70.

As described above, in the semiconductor device 2 according to this embodiment of the invention as well as the semiconductor device according to the first embodiment of the invention, the thermal conduction member 40 is provided on the surface of the central portion of the electrode 36. Thus, even in the case where the semiconductor device 2 operates in a short-circuit state, heat generated by the IGBT's in the emitter central region 70 is diffused via the thermal conduction member 40. Thus, the short-circuit capacity of the emitter central region 70 can be enhanced. Besides, although the thermal conduction member 40 is not provided on the surface of the peripheral portions of the electrode 36, the density of energy density applied to the emitter peripheral regions 72 can be made lower than the density of energy applied to the emitter central region 70, as described above. As a result, the short-circuit capacity of the emitter peripheral regions 72 as well as the short-circuit capacity of the emitter central region 70 can be enhanced. Accordingly, the short-circuit capacity of the entire semiconductor device 2 in the case where the semiconductor device 2 operates in a short-circuit state can be enhanced.

Incidentally, as described above, when the semiconductor device 2 according to this embodiment of the invention is turned off, the collector current disappears later in the emitter peripheral regions 72 than in the emitter central region 70. Thus, the energy density in the emitter peripheral regions 72 temporarily becomes higher than the energy density in the emitter central region 70. In general, however, the external gate resistance of the semiconductor device 2 in turning off the short-circuit current is set to a very high value, and hence is hardly influential.

Although the concrete examples of the invention have been described above in detail, these examples are nothing but exemplification, and are not intended to limit the claims. The art stated in the claims includes various modifications and alterations of the above-exemplified concrete examples. For example, the following modification examples may be adopted.

Modification Example 1

The protective membranes 38 and the electrode 36 may be joined together via a joining material, for example, a solder or the like.

Modification Example 2

The method of changing the threshold voltages of the gate electrodes 22 according to location in the first embodiment of the invention, and the method of changing the gate resistance values of the gate electrodes 22 according to location are not limited to the aforementioned ones, but any other methods may be employed.

Modification Example 3

Instead of the IGBT's, other power semiconductor elements equipped with insulated gate electrodes, such as MOSFET's or the like, may be built into the semiconductor substrate 10. Besides, the semiconductor substrate 10 is not necessarily made of Si, but may be made of SiC or GaN.

Besides, the technical elements described in the present specification or the drawings offer a technical advantage alone or in various combinations, and are not limited to the combination stated in the claims at the time of the filing of the application. Besides, the art exemplified in the present specification or the drawings achieves a plurality of objects at the same time, and has a technical advantage simply by achieving one of the objects.

What is claimed is:

1. A semiconductor device comprising:
a semiconductor element region having a plurality of first insulated gates and a plurality of second insulated gates;
an electrode that is formed on a surface of the semiconductor element region;
a thermal conduction member that is located on a surface side of a central portion of the electrode;
a central region formed on a back side of the central portion of the electrode, the plurality of first insulated gates formed in the central region;
a protective membrane that is formed on a surface of the electrode on a peripheral portion surrounding the central portion;
a peripheral region formed on a back side of the peripheral portion, the plurality of second insulated gates formed in the peripheral region, the plurality of first insulated gates different than the plurality of second insulated gates, wherein, the thermal conduction member being higher in thermal conductivity than the protective membrane, and the plurality first and second insulated gates formed such that electric current flows through the peripheral region for a shorter period of time than through the central region.

2. The semiconductor device according to claim 1, wherein an average of threshold voltages of the plurality of first insulated gates at a time when the central region is turned on is lower than an average of threshold voltages of the plurality of second insulated gates at a time when the peripheral region is turned on.

3. The semiconductor device according to claim 1, wherein an average of gate resistance values of the plurality of first insulated gates is lower than an average of gate resistance values of the plurality of second insulated gates.

4. The semiconductor device according to claim 3, further comprising a plurality of trenches formed in a surface of the semiconductor element region, wherein the plurality of insulated gates comprise insulating membranes formed on wall surfaces of the plurality of trenches, a width of the trenches in the central region being different than a width of the tranches in the peripheral region.

5. The semiconductor device according to claim 1, wherein the plurality of insulated gates comprise insulating membranes, and further comprising (i) a plurality of body regions formed in contact with a corresponding insulating membrane of the plurality of insulating membranes, and (ii) a plurality of non-element regions, the plurality of insulated gates not formed in the non-element regions, the non-element regions formed in a deeper position within the semiconductor element region than body regions.

6. The semiconductor device according to claim 5, wherein a thickness of one or more of the insulating membranes is different than a thickness of one or more of different ones of the insulating membranes, the thickness of the insulating membranes varying the threshold voltages of corresponding insulated gates.

7. The semiconductor device according to claim 1, wherein the electrode and the plurality of insulated gates form part of a plurality of insulated gate bipolar transistors (IGBTs), the plurality of insulated gates formed such that a saturation current flowing through the IGBTs in the peripheral region is lower than a saturation current flowing through the IGBTs in the central region.

8. The semiconductor device according to claim 7, wherein the plurality of insulated gates are formed such that the IGBTs in the peripheral region are turned on by current flow later than current flow that turns on the IGBTs in the central region.

9. The semiconductor device according to claim 7, wherein the plurality of insulated gates are formed such that a density of energy applied to the peripheral region is lower than a density of energy applied to the central region, thereby limiting temperature increase in the peripheral region.

* * * * *